(12) United States Patent
Shiraishi

(10) Patent No.: US 11,675,184 B2
(45) Date of Patent: Jun. 13, 2023

(54) LIGHT DEFLECTOR

(71) Applicant: OLYMPUS CORPORATION, Tokyo (JP)

(72) Inventor: Naoki Shiraishi, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 443 days.

(21) Appl. No.: 17/004,261

(22) Filed: Aug. 27, 2020

(65) Prior Publication Data

US 2020/0393669 A1 Dec. 17, 2020

Related U.S. Application Data

(63) Continuation of application No. PCT/JP2018/022381, filed on Jun. 12, 2018.

(51) Int. Cl.
*G02B 26/08* (2006.01)
*G02B 26/10* (2006.01)

(52) U.S. Cl.
CPC ......... *G02B 26/0816* (2013.01); *G02B 26/10* (2013.01)

(58) Field of Classification Search
CPC .. G02B 26/0816; G02B 26/10; G02B 26/105; G02B 26/0833; B81B 3/00
See application file for complete search history.

(56) References Cited

U.S. PATENT DOCUMENTS 8,941,906 B2 * 1/2015 Tanaka ................. G02B 26/101
359/224.1
2012/0162739 A1 6/2012 Yamada 2013/0083379 A1 4/2013 Tanaka et al.
2014/0139898 A1 5/2014 Yamada
2014/0313558 A1 10/2014 Davis et al.
(Continued)

FOREIGN PATENT DOCUMENTS

JP 2004-325578 A 11/2004
JP 2010-128116 A 6/2010
(Continued)

OTHER PUBLICATIONS

International Search Report dated Aug. 28, 2018 issued in PCT/JP2018/022381.

*Primary Examiner* — Euncha P Cherry
(74) *Attorney, Agent, or Firm* — Scully, Scott, Murphy & Presser, P.C.

(57) ABSTRACT

A light deflector includes a movable unit having a reflective surface, an elastic member that supports the movable unit in a tiltable manner about a tilting axis, and a supporter that supports the elastic member. The elastic member has a first connection segment whose rigidity changes continuously, and is connected to the movable unit at the first connection segment. The rigidity changes continuously between the elastic member and the movable unit via the first connection segment. The elastic member includes a linear segment having a substantially fixed width, the elastic member has a second connection segment that is provided between the linear segment and the supporter and that connects the linear segment and the supporter, a width of the second connection segment gradually increases toward the supporter, and a maximum width of the first connection segment is greater than a maximum width of the second connection segment.

14 Claims, 12 Drawing Sheets

(56) References Cited

U.S. PATENT DOCUMENTS

| | | |
|---|---|---|
| 2014/0355091 A1 | 12/2014 | Mizutani |
| 2015/0103386 A1 | 4/2015 | Tanaka et al. |
| 2015/0323783 A1 | 11/2015 | Horie et al. |
| 2016/0356984 A1 | 12/2016 | Horie et al. |
| 2019/0293927 A1 | 9/2019 | Shiraishi |

FOREIGN PATENT DOCUMENTS

| | | |
|---|---|---|
| JP | 2012-063413 A | 3/2012 |
| JP | 2012-133242 A | 7/2012 |
| JP | 5168659 B2 | 3/2013 |
| JP | 2013-080068 A | 5/2013 |
| JP | 2014-235245 A | 12/2014 |
| JP | 5736766 B2 | 6/2015 |
| JP | 5857602 B2 | 2/2016 |
| JP | 6031683 B2 | 11/2016 |
| WO | WO 2018/109908 A1 | 6/2018 |

\* cited by examiner

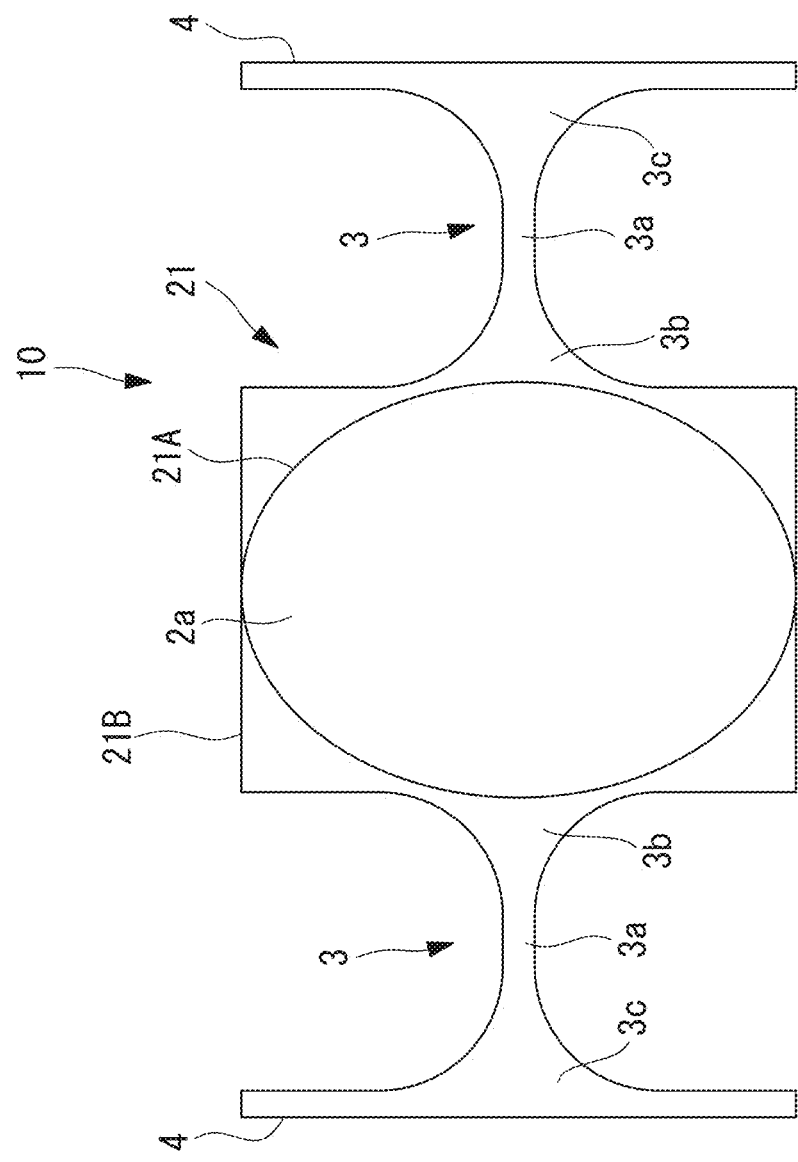

LIGHT DEFLECTOR

CROSS-REFERENCE TO RELATED APPLICATIONS

This is a continuation of International Application PCT/JP2018/022381, with an international filing date of Jun. 12, 2018, which is hereby incorporated by reference herein in its entirety.

TECHNICAL FIELD

The present invention relates to light deflectors. In particular, the present invention relates to a light deflector in which a movable unit having a reflective surface is supported in a tiltable manner by a beam formed of an elastic member and in which the movable unit is tilted about a twisting axis of the beam so as to change the direction of light reflected at the reflective surface.

BACKGROUND ART

Light deflectors fabricated by using micromachining are attracting attention. Micromachining is based on semiconductor manufacturing technology and is superior in that it allows for mass production of compact and inexpensive light deflectors. In recent years, there has been a trend toward improving the scan rate of light beams in light deflectors. When the scan rate is increased, the kinetic energy of a movable unit in the light deflector increases, thus causing dynamic distortion of a reflective surface to increase when the light deflector is driven. This leads to the problem of a deterioration in the shape of a beam spot. In order to solve such a problem, several proposals have been made (e.g., see The Publication of Japanese Patent No. 5168659).

The light deflector disclosed in The Publication of Japanese Patent No. 5168659
supports a movable plate having a reflective surface from opposite sides by using a twisting beam, and causes the movable plate to tilt about the twisting beam acting as an axis, thereby scanning light to be reflected. In The Publication of Japanese Patent No. 5168659,
ribs are provided near a connection area between the movable plate and the twisting beam for the purpose of suppressing distortion in the reflective surface caused by stress occurring in the twisting beam due to the twisting motion.

SUMMARY OF INVENTION

An aspect of the present invention provides a light deflector including a movable unit having a reflective surface, an elastic member that supports the movable unit in a tiltable manner about a tilting axis, and a supporter that supports the elastic member. The elastic member has a first connection segment whose rigidity changes continuously, and is connected to the movable unit at the first connection segment. The rigidity changes continuously between the elastic member and the movable unit via the first connection segment. the elastic member includes a linear segment having a substantially fixed width, the elastic member has a second connection segment that is provided between the linear segment and the supporter and that connects the linear segment and the supporter, a width of the second connection segment gradually increases toward the supporter, and a maximum width of the first connection segment is greater than a maximum width of the second connection segment.

BRIEF DESCRIPTION OF DRAWINGS

FIG. 8B is a top view of the light deflector in FIG. 8A.

DESCRIPTION OF EMBODIMENTS

A light deflector according to an embodiment of the present invention will be described below with reference to the drawings.

The present invention is not to be limited to the following embodiment. Specifically, although the following description of the embodiment includes many specific detailed contents for the purpose of exemplification, the embodiment does not exceed the scope of the invention even if different variations or modifications are added to these detailed contents. Therefore, the exemplary embodiment of the present invention to be described below is described without the claims losing generality or without being limited whatsoever.

Figure 1A:
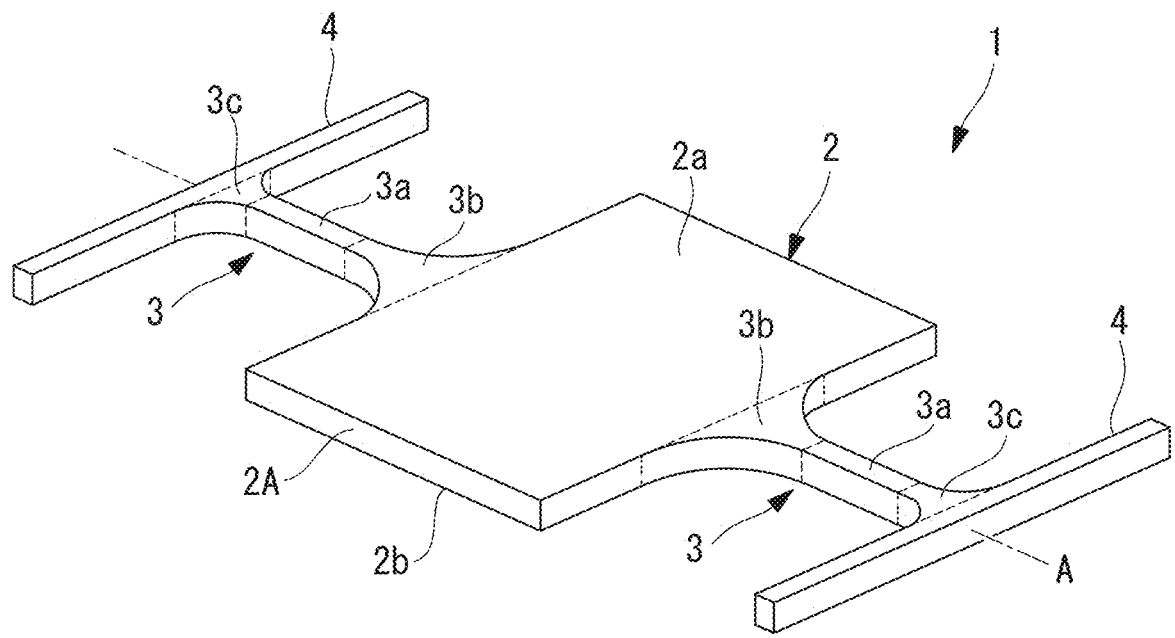
FIG. 1A is a top perspective view of a light deflector according to an embodiment of the present invention.
Figure 1B:
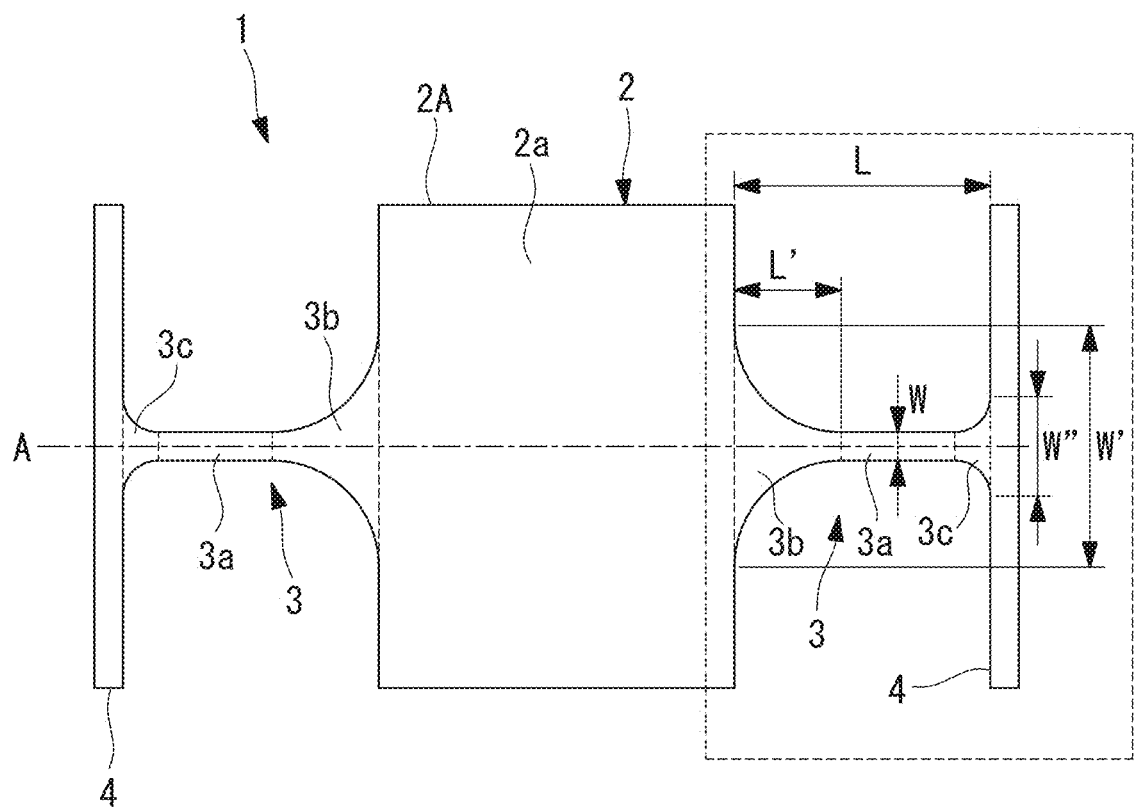
FIG. 1B is a top view of the light deflector in FIG. 1A, as viewed in a height direction from a reflective-surface side.

As shown in FIGS. 1A and 1B, a light deflector 1 according to this embodiment includes a movable unit 2 having a reflective surface 2a, a pair of elastic members 3 that support the movable unit 2 in a tiltable manner about a tilting axis A, a pair of supporters 4 that support the respective elastic members 3, and a driving-force generating member 5 (see FIGS. 10 and 11) provided in the movable unit 2.

In the following description, the term "length" refers to a dimension in the lengthwise direction parallel to the tilting axis A, the term "width" refers to a dimension in the widthwise direction orthogonal to the tilting axis A and parallel to the reflective surface 2a in a stationary state, and the term "height" refers to a dimension in a direction orthogonal to the lengthwise direction and the widthwise direction.

The movable unit 2 is formed of a single movable plate 2A. The movable plate 2A and the elastic members 3 are formed of a single layer having a substantially fixed height. The movable plate 2A is a solid body having the reflective surface 2a, which is rectangular, as an end surface, and the side surfaces of the movable plate 2A are orthogonal to the reflective surface 2a. The surface opposite the reflective surface 2a is a driving-force generating surface 2b. The driving-force generating surface 2b is provided with the driving-force generating member 5 for tilting the movable unit 2. It is preferable that the reflective surface 2a and the driving-force generating surface 2b both have high flatness.

The driving-force generating member 5 generates a driving force for rotating the movable unit 2 about the tilting axis A. The driving-force generating member 5 varies depending on how the light deflector 1 is driven. For example, in an electromagnetically driven type, the driving-force generating member 5 is a drive coil routed along the edges of the movable unit 2. In an electrostatically driven type, the driving-force generating member 5 is a pair of drive electrodes extending substantially over the entire surface of the movable unit 2. Configuration examples of the driving-force generating member 5 will be described later.

The pair of elastic members 3 are prismatic members having a rectangular cross section and extend symmetrically from opposite sides of the movable unit 2. Each elastic member 3 is a narrow-beam-like member, as compared with the movable unit 2. The rigidity of the movable unit 2 is greater than the rigidity of each elastic member 3. The tilting axis A extends inside the elastic members 3 in the longitudinal direction of the elastic members 3. The movable unit 2 is supported in a tiltable manner about the tilting axis A relative to the pair of supporters 4. The reflective surface 2a of the movable unit 2 deflects a light beam by reflecting the light beam. When a driving force is applied to the movable unit 2 from the driving-force generating member 5, the movable unit 2 tilts, that is, oscillates, while twisting the pair of elastic members 3 about the tilting axis A. As a result, the light beam deflected by the reflective surface 2a of the movable unit 2 is periodically scanned at a fixed angular width.

Each elastic member 3 has a linear segment 3a extending along the tilting axis A, and also has two connection segments 3b and 3c located at the opposite sides of the linear segment 3a. The elastic members 3 are connected to the movable unit 2 at the first connection segments 3b, and are connected to the supporters 4 at the second connection segments 3c. The supporters 4 are sections to be fixed to a structure surrounding the light deflector 1 and are provided at the opposite sides of the movable unit 2 in the lengthwise direction. For example, the supporters 4 are formed of the same layer as the movable plate 2A and the elastic members 3.

With regard to each linear segment 3a, the cross-sectional shape thereof in the direction orthogonal to the tilting axis A is substantially square. The width of the linear segment 3a is substantially fixed, and the rigidity of the linear segment 3a is substantially fixed.

Each first connection segment 3b is a continuous-rigidity region where the rigidity continuously changes in a direction parallel to the tilting axis A. In detail, the first connection segment 3b has two first side surfaces opposed to each other in the widthwise direction. Each first side surface is a recessed curved surface having a first radius of curvature R1. One end of each first side surface at the linear segment 3a side connects smoothly with the corresponding side surface of the linear segment 3a, whereas the other end of each first side surface at the movable unit 2 side connects smoothly with the corresponding side surface of the movable unit 2. The width of the first connection segment 3b gradually increases from one end at the linear segment 3a side toward the other end at the movable unit 2 side, and the ratio of the width to the height gradually increases from one end toward the other end. Therefore, the rigidity of the first connection segment 3b gradually increases from one end toward the other end. Accordingly, the rigidity continuously changes between the linear segment 3a and the movable unit 2 via the first connection segment 3b.

As shown in FIG. 1B, the first connection segment 3b has a maximum width W' at the other end connected to the movable unit 2. The maximum width W' is three or more times the width W of the linear segment 3a. The first connection segment 3b has a length L' that is 1/10 or more of the overall length L of the elastic member 3.

For example, the light deflector 1 is formed of a monocrystalline silicon substrate by utilizing a semiconductor process. Due to having high rigidity and little internal damping in the material, monocrystalline silicon is suitable for use as the material of the elastic members 3 for resonant-driving, and is also suitable for use as the material of the supporters 4 that are to be bonded to an external component.

Figure 2:
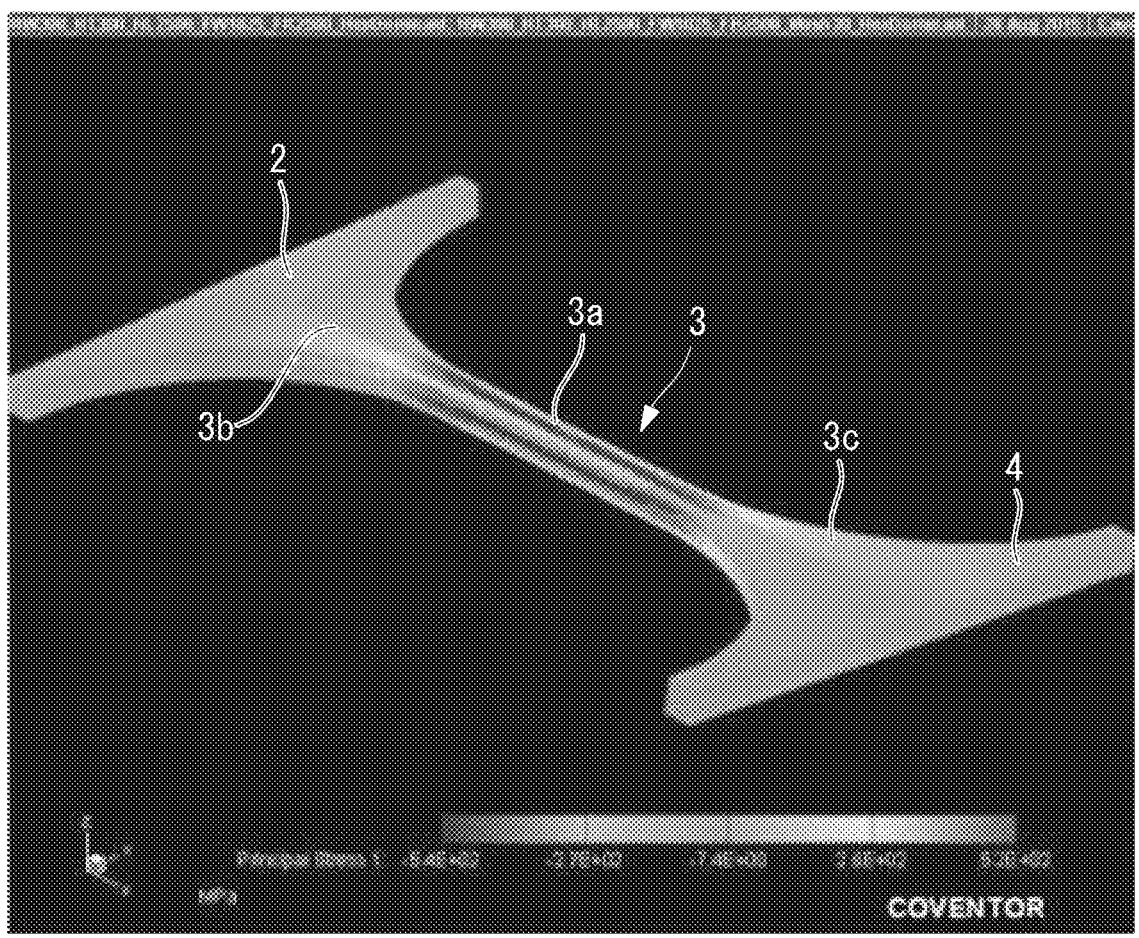
FIG. 2 illustrates an example of a simulation result of first principal stress occurring in the light deflector when elastic members having first connection segments serving as continuous-rigidity regions are twisted.

FIG. 2 illustrates an example of a result obtained by analyzing the distribution of stress (first principal stress) occurring in the light deflector 1 based on a simulation when each elastic member 3 having the first connection segment 3b serving as a continuous-rigidity region is twisted about the tilting axis A. In the simulation in FIG. 2, a model of a part of the light deflector 1 surrounded by a rectangle in FIG. 1B is used. It is clear from FIG. 2 that, with the first connection segment 3b provided as the continuous-rigidity region, an inertial force occurring when the movable unit 2 tilts is confined within the elastic member 3 and is also distributed within the elastic member 3. Specifically, the stress in the elastic member 3 is not transmitted to the movable unit 2, and stress concentration does not occur. Therefore, even if the torsional rigidity of the elastic member 3 is increased, the movable unit 2 is less likely to deform and the elastic member 3 is less likely to break due to the stress in the elastic member 3.

Figure 3A:
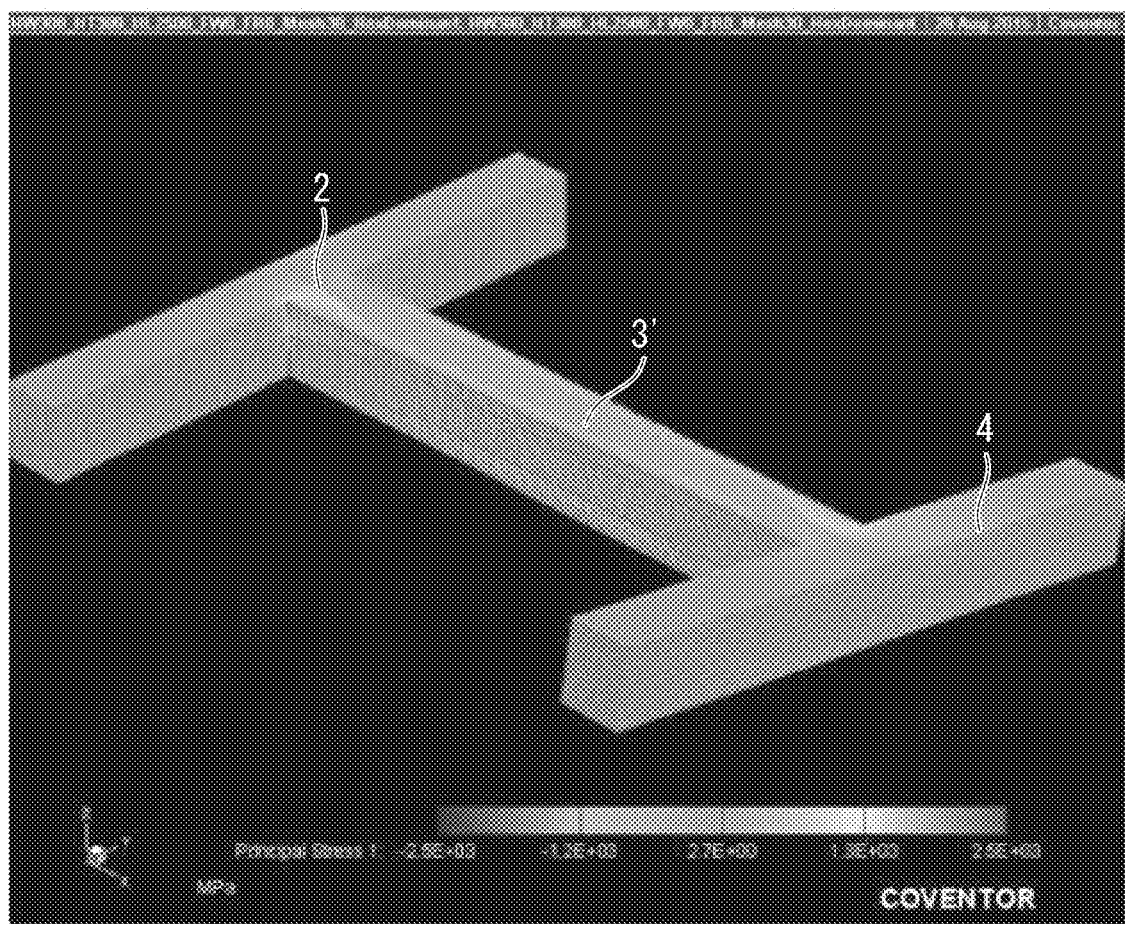
FIG. 3A illustrates a simulation result of first principal stress occurring when elastic members not having first connection segments serving as continuous-rigidity regions are twisted.
Figure 3B:
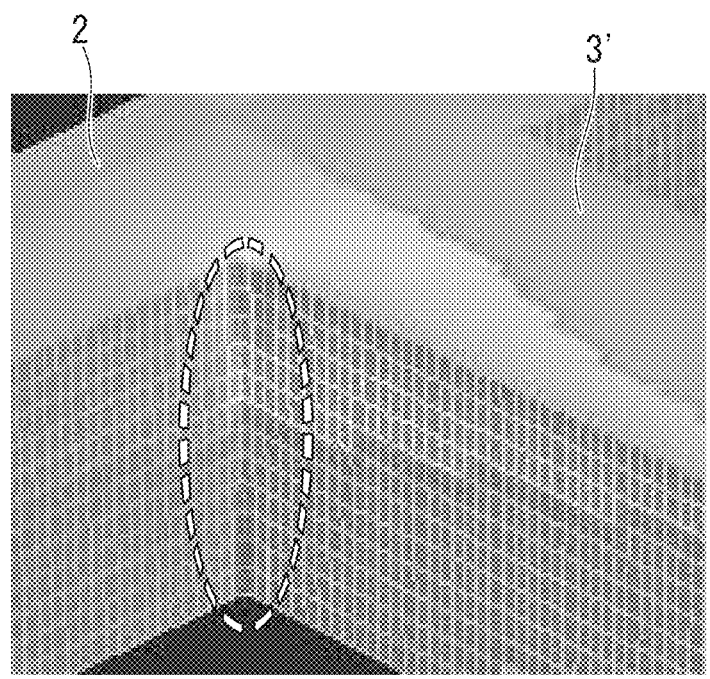
FIG. 3B is a partially enlarged view of FIG. 3A.

FIGS. 3A and 3B illustrate a simulation result of the distribution of stress (first principal stress) occurring in a light deflector when an elastic member 3' of a light deflector according to a comparative example not having a first connection segment serving as a continuous-rigidity region is twisted about the tilting axis A. FIG. 3B is a partially enlarged view of FIG. 3A.

In FIGS. 3A and 3B, the rigidity is discontinuous at a connection position between the elastic member 3' and the movable unit 2. In this case, the point of application of an inertial force occurring when the movable unit 2 is tilted is the connection position, and stress concentration occurs at the connection position, as shown in FIG. 3B. The stress at the stress concentrated position increases with increasing torsional rigidity of the elastic member 3'. Therefore, the light deflector tends to break easily as the torsional rigidity of the elastic member 3' increases.

FIGS. 3A to 7 illustrate analysis results of optimal dimensions of the first connection segment 3b serving as a continuous-rigidity region.

Figure 4:
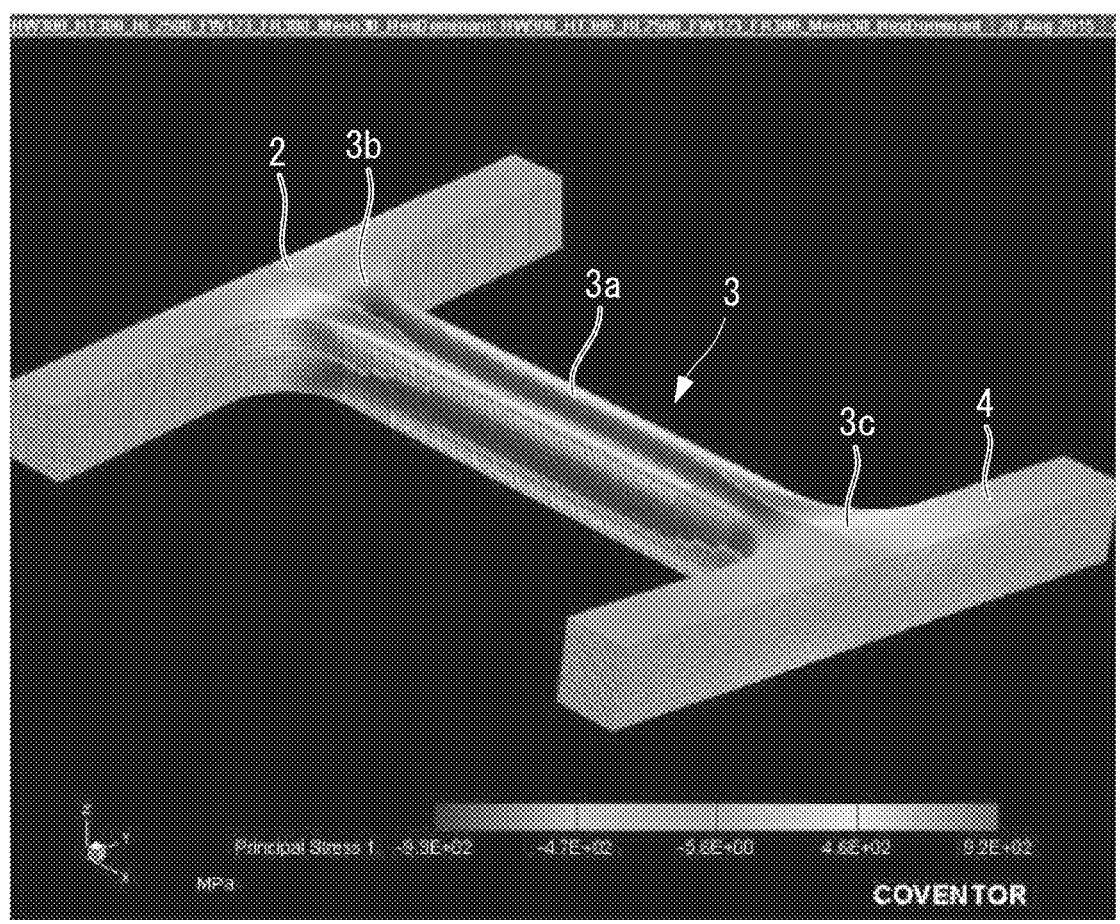
FIG. 4 illustrates another example of a simulation result of the first principal stress occurring when the elastic members having the first connection segments serving as continuous-rigidity regions are twisted.
Figure 5:
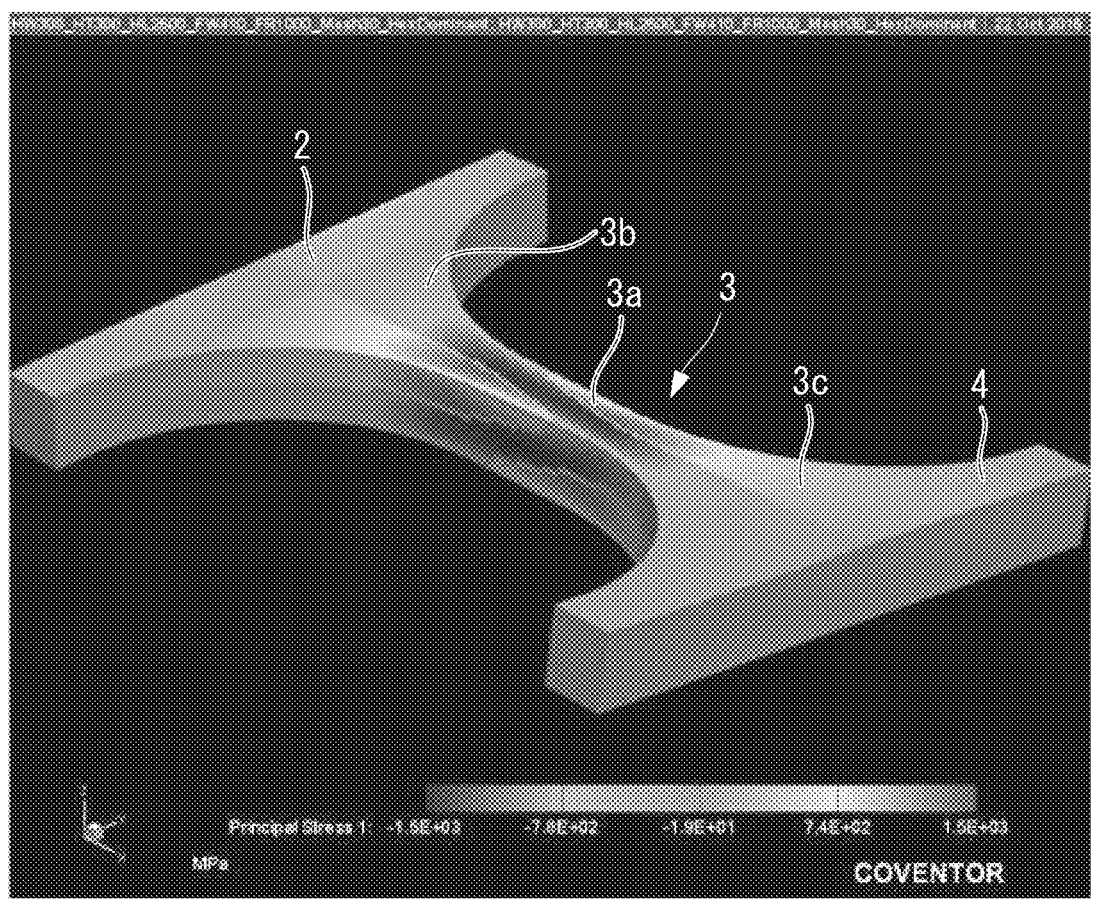
FIG. 5 illustrates another example of a simulation result of the first principal stress occurring when the elastic members having the first connection segments serving as continuous-rigidity regions are twisted.

As shown in FIGS. 3A, 4, and 5, with regard to elastic members 3 having different first curvature radii R1, the first principal stress occurring when the movable unit 2 is tilted about the tilting axis A by a certain angle and the spring constant (torsional rigidity) are analyzed by using the finite element method. FIG. 3A illustrates a simulation result of the light deflector according to the comparative example in which the first radius of curvature R1 is zero, that is, the elastic member 3' is not provided with a first connection segment 3b serving as a continuous-rigidity region. FIGS. 4 and 5 illustrate examples of simulation results of the light deflector 1 in which the elastic member 3 is provided with a first connection segment 3b serving as a continuous-rigidity region. In the simulations in FIGS. 3A to 5, the model of the part of the light deflector 1 surrounded by the rectangle in FIG. 1B is used.

Figure 6:
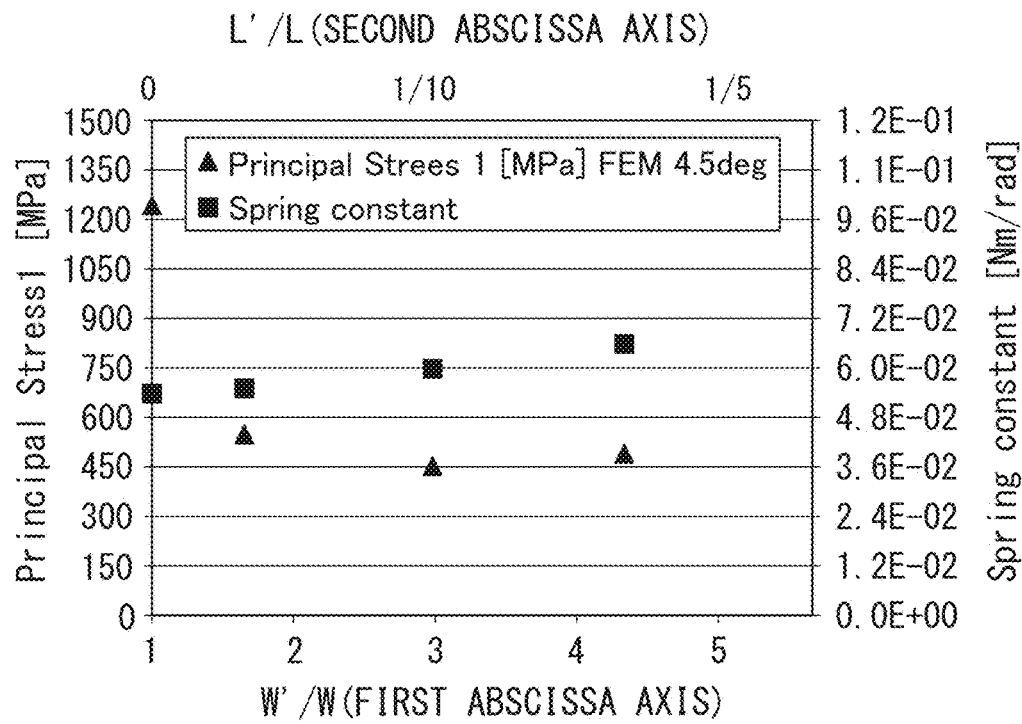
FIG. 6 illustrates the relationship among the dimension of each first connection segment, the first principal stress, and the spring constant (torsional rigidity).
Figure 7:
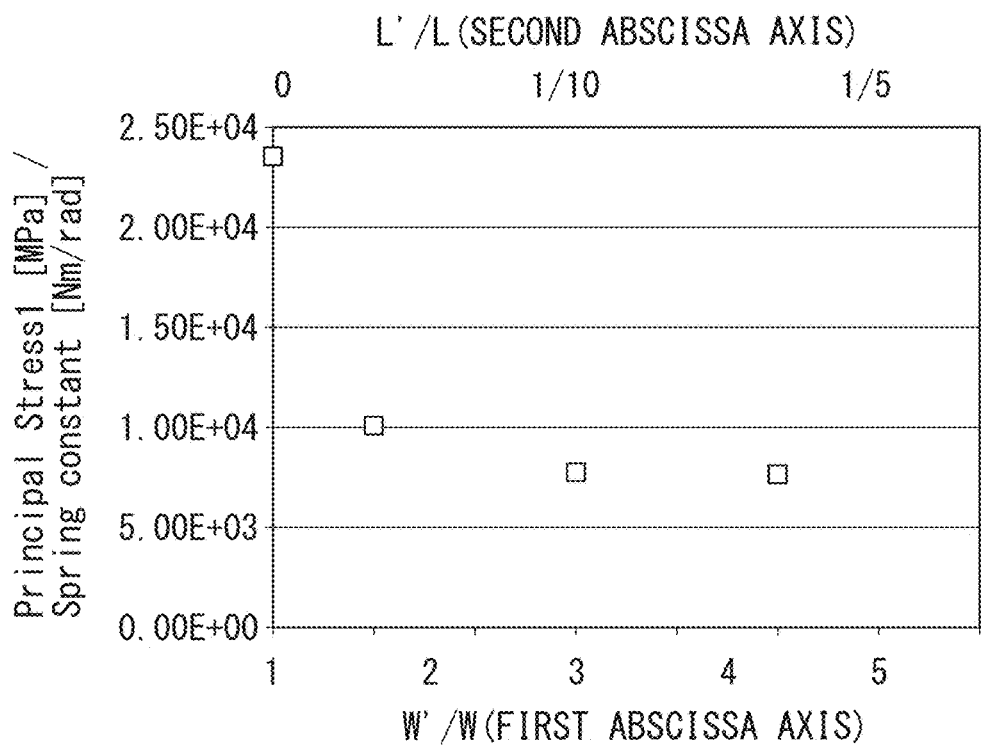
FIG. 7 illustrates the relationship between the dimension of each first connection segment and the ratio of the first principal stress to the torsional rigidity.

FIG. 6 illustrates the relationship among the radius of curvature R1, the first principal stress, and the spring constant (torsional rigidity). FIG. 7 illustrates the relationship between the radius of curvature R1 of the first connection segment 3b and the ratio of the first principal stress to the torsional rigidity. In FIGS. 6 and 7, the radius of curvature R1 has been converted into W'/W (first abscissa axis) and L'/L (second abscissa axis). The ordinate axis in FIG. 7 indicates a value obtained by dividing the first principal stress by the spring constant (torsional rigidity).

As the stress occurring relative to the torsional rigidity decreases, the elastic member 3 is less likely to break even if it is increased in rigidity, thus contributing to an increased scanning rate. As shown in FIG. 7, the stress occurring relative to the torsional rigidity is at maximum when W'/W=L'/L=1 (i.e., when the first connection segment 3b serving as a continuous-rigidity region is not provided), and decreases as W'/W and L'/L increase (i.e., as the radius of curvature R1 increases). Based on this analysis result, the radius of curvature R1 and the dimensions W' and L' of the first connection segment 3b are preferably designed such that the width W' of the first connection segment 3b is three or more times the width W of the elastic member 3 and the length L' of the first connection segment 3b is 1/10 or more of the overall length L of the elastic member 3.

As described above, in the light deflector 1 according to this embodiment, the elastic members 3 are provided with the first connection segments 3b serving as continuous-rigidity regions, so that stress occurring in the elastic members 3 when the movable unit 2 is tilted is confined within the elastic members 3, and the occurrence of stress concentration is prevented. Accordingly, deformation of the movable unit 2 caused by the stress in the elastic members 3 can be suppressed, and high torsional rigidity of the elastic members 3 and high breakage resistance of the light deflector 1 can both be achieved.

In this embodiment, the supporters 4 have greater rigidity than the linear segments 3a. Therefore, it is preferable that the second connection segments 3c be continuous-rigidity regions where the rigidity changes continuously in the direction parallel to the tilting axis A.

In detail, as shown in FIGS. 1A and 1B, each second connection segment 3c has two second side surfaces opposed to each other in the widthwise direction. Each of the second side surfaces is a recessed curved surface having a second radius of curvature R2. One end of each second side surface at the linear segment 3a side connects smoothly with the corresponding side surface of the linear segment 3a, whereas the other end of each second side surface at the supporter 4 side connects smoothly with the corresponding side surface of the supporter 4. The width of the second connection segment 3c gradually increases from one end at the linear segment 3a side toward the other end at the supporter 4 side, and the ratio of the width to the height gradually increases from one end toward the other end. Therefore, the rigidity of the second connection segment 3c gradually increases from one end toward the other end. Accordingly, the rigidity continuously changes between the linear segment 3a and the supporter 4 via the second connection segment 3c.

Accordingly, the second connection segments 3c serve as continuous-rigidity regions, so that the occurrence of stress concentration when the elastic members 3 are twisted about the tilting axis A due to tilting of the movable unit 2 is prevented more reliably, thereby more reliably preventing the elastic members 3 from breaking.

The maximum width W' of each first connection segment 3b is preferably greater than a maximum width W" of each second connection segment 3c. Therefore, the first radius of curvature R1 is preferably larger than the second radius of curvature R2.

By making the first radius of curvature R1 larger than the second radius of curvature R2, the point of application of stress occurring when the elastic members 3 are twisted can be located away from the movable unit 2, thereby further suppressing deformation of the movable unit 2 caused by stress occurring in the elastic members 3.

In this embodiment, the side surfaces of each first connection segment 3b are curved surfaces having the first radius of curvature R1, which is fixed. Alternatively, the side surfaces may have other shapes, so long as the rigidity of the first connection segment 3b gradually increases from the linear segment 3a side toward the movable unit 2 side and the rigidity between the elastic member 3 and the movable unit 2 changes continuously. For example, the radius of curvature of the side surfaces of each first connection segment 3b may change between one end and the other end of the first connection segment 3b. As another alternative, the side surfaces of each first connection segment 3b may partially be flat.

Similar to the first connection segment 3b, the side surfaces of each second connection segment 3c may also have other shapes, so long as the rigidity of the second connection segment 3c gradually increases from the linear segment 3a side toward the supporter 4 side and the rigidity between the elastic member 3 and the supporter 4 changes continuously.

Figure 8A:
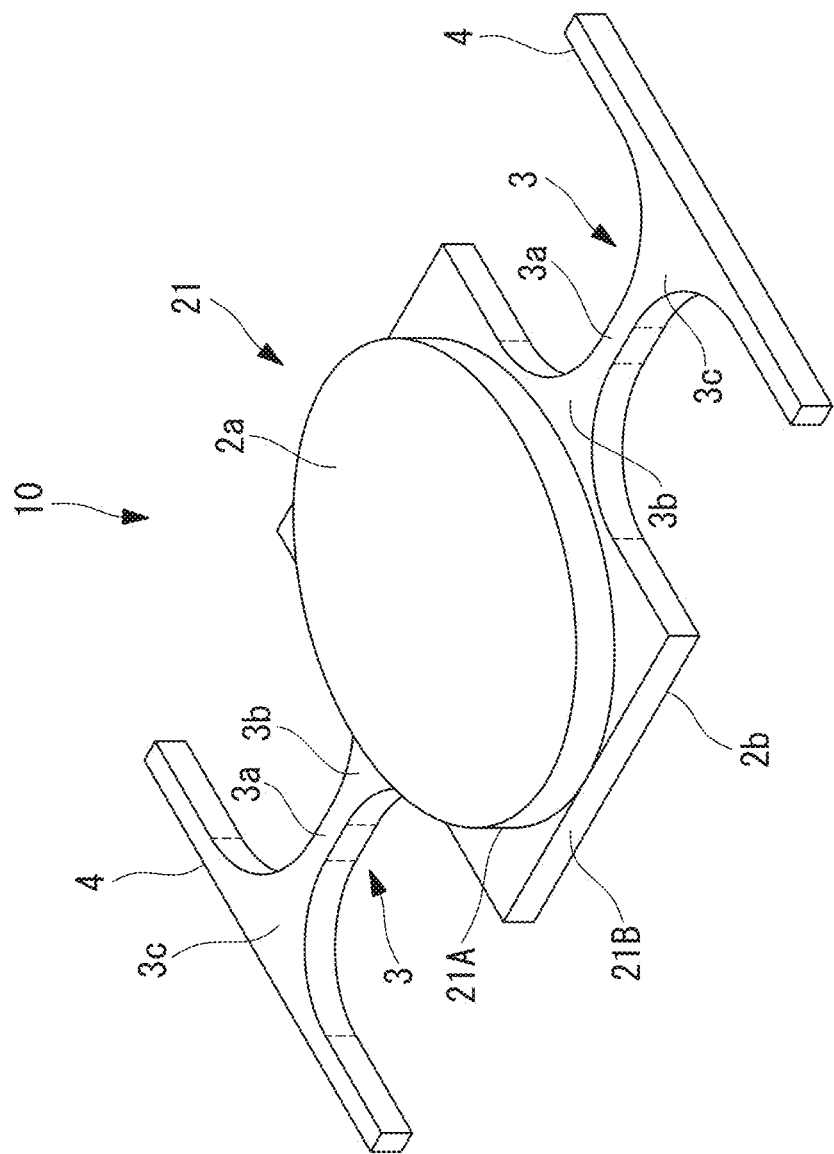
FIG. 8A is a top perspective view of a modification of the light deflector in FIG. 1A.

In this embodiment, the movable unit 2 includes a single movable plate 2A. Alternatively, as shown in FIGS. 8A and 8B, a movable unit 21 may include two movable plates 21A and 21B.

The first movable plate 21A has an elliptical reflective surface 2a, and the side surfaces of the first movable plate 21A are orthogonal to the reflective surface 2a. The second movable plate 21B has a rectangular driving-force generating surface 2b, and the side surfaces of the second movable plate 21B are orthogonal to the driving-force generating surface 2b. The first movable plate 21A and the second movable plate 21B are joined together such that the reflective surface 2a and the driving-force generating surface 2b are disposed at opposite outer sides from each other.

The reflective surface 2a has an area smaller than that of the driving-force generating surface 2b. For example, the driving-force generating surface 2b is long in the widthwise direction, and the reflective surface 2a has a long diameter in the widthwise direction. In plan view from the height direction, it is particularly preferable that the ellipse of the reflective surface 2a be substantially inscribed within the rectangle of the driving-force generating surface 2b.

The second movable plate 21B is preferably formed of the same layer as the elastic members 3. With this configuration, the reaction force of the elastic members 3 transmitted to the reflective surface 2a can be reduced, as compared with a configuration in which the first movable plate 21A is formed of the same layer as the elastic members 3.

The movable unit 21 in FIGS. 8A and 8B has an increased height, as compared with the movable unit 2 in FIGS. 1A and 1B, thereby achieving reduced dynamic distortion. In this case, since the moment of inertia of the movable unit 21 increases, the torsional rigidity of the elastic members 3 has to be increased to improve the scan rate. In a light deflector 10 according to this modification, the elastic members 3 are provided with the first connection segments 3b serving as continuous-rigidity regions, so that stress occurring in the elastic members 3 when the movable unit 21 is tilted is confined within the elastic members 3, and the occurrence of stress concentration can be prevented. Accordingly, elastic members 3 that have high torsional rigidity and that are less likely to break can be realized.

Figure 9A:
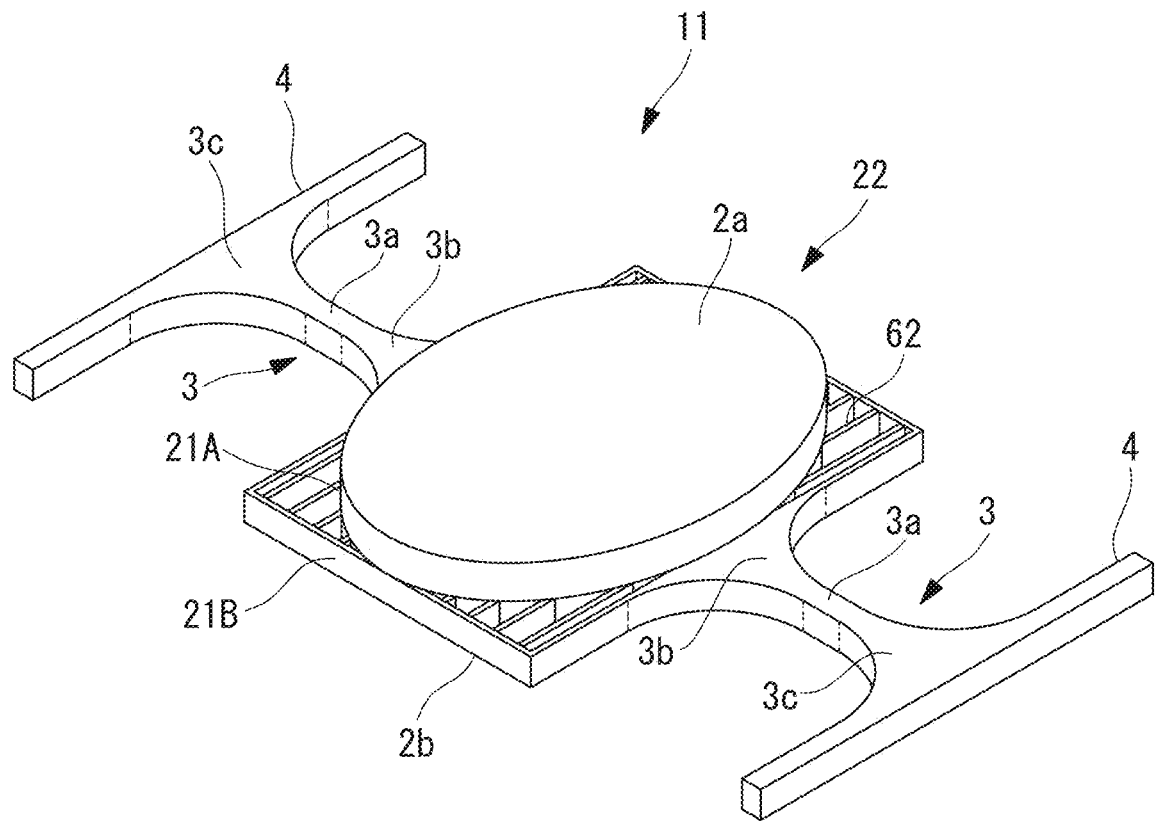
FIG. 9A is a top perspective view of another modification of the light deflector in FIG. 1A.
Figure 9B:
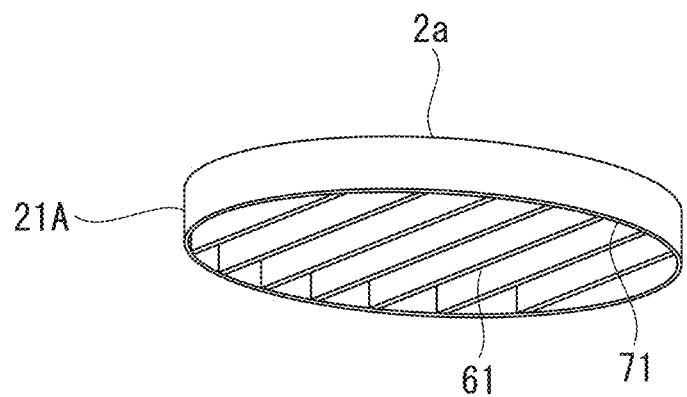
FIG. 9B is a bottom perspective view of a first movable plate of the light deflector in FIG. 9A.
Figure 9C:
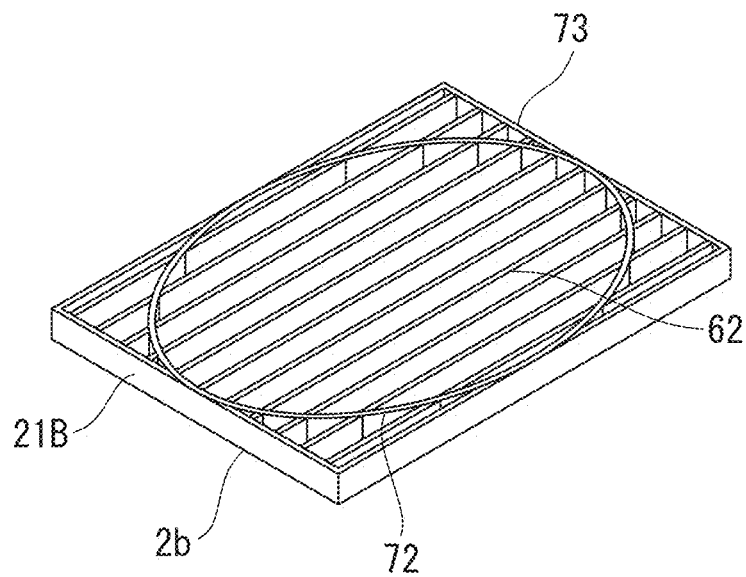
FIG. 9C is a top perspective view of a second movable plate of the light deflector in FIG. 9A.

As shown in FIGS. 9A to 9C, the first movable plate 21A and the second movable plate 21B are provided with first ribs 61 and second ribs 62, respectively.

The first ribs 61 are provided at the underside of the reflective surface 2a. The first ribs 61 protrude from the underside of the reflective surface 2a and extend in the direction parallel to the tilting axis A.

The second ribs 62 are provided at the underside of the driving-force generating surface 2b. The second ribs 62 protrude from the underside of the driving-force generating surface 2b and extend in the direction orthogonal to the tilting axis A.

The first ribs 61 and the second ribs 62 intersect each other three-dimensionally, and parts of the first ribs 61 are joined to parts of the second ribs 62. A state where two components intersect each other three-dimensionally refers to a state where one component is located above the other component and extends in a direction intersecting the longitudinal direction of the other component. The first ribs 61 and the second ribs 62 are joined to each other at the intersecting positions.

The first movable plate 21A is a solid body having the reflective surface 2a as an end surface, and has a first frame 71 having an elliptical ring shape and provided along the outer periphery of the reflective surface 2a. Similar to the first ribs 61, the first frame 71 protrudes from the underside of the reflective surface 2a.

The second movable plate 21B has a second frame 72 joined to the first frame 71. The second frame 72 has an elliptical contour shape identical to that of the first frame 71. The second movable plate 21B is a solid body having a rectangular end surface and has a third frame 73 having a rectangular ring shape and provided along the outer periphery of the rectangular end surface. Similar to the second ribs 62, the second frame 72 and the third frame 73 protrude from the underside of the driving-force generating surface 2b.

A movable unit 22 in FIGS. 9A to 9C achieves an improved scan rate owing to the movable unit 22 being hollow. In this case, the hollow movable unit 22 has lower rigidity against inertia force, as compared with the movable units 2 and 21 that are not hollow. Therefore, in order to suppress deformation of the hollow movable unit 22, it is necessary to prevent stress from being applied to the movable unit 22. In a light deflector 11 according to this modification, the elastic members 3 are provided with the first connection segments 3b serving as continuous-rigidity regions, so that stress occurring in the elastic members 3 when the movable unit 22 is tilted is confined within the elastic members 3, and the transmission of stress toward the movable unit 22 is prevented. Accordingly, dynamic distortion of the movable plate 21A caused by stress in the elastic members 3 can be suppressed, regardless of the movable plates 21A and 21B being hollow.

Figure 10:
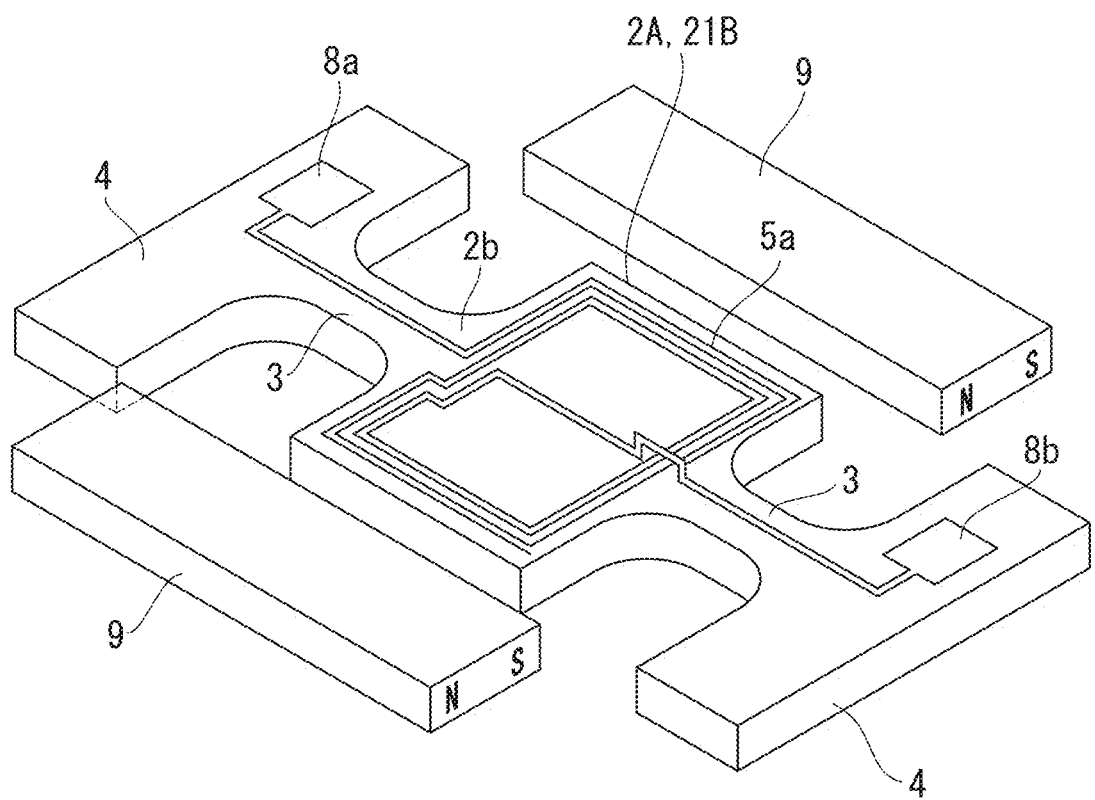
FIG. 10 illustrates the configuration of a driving-force generating member in a light deflector of the electromagnetically driven type.
Figure 11:
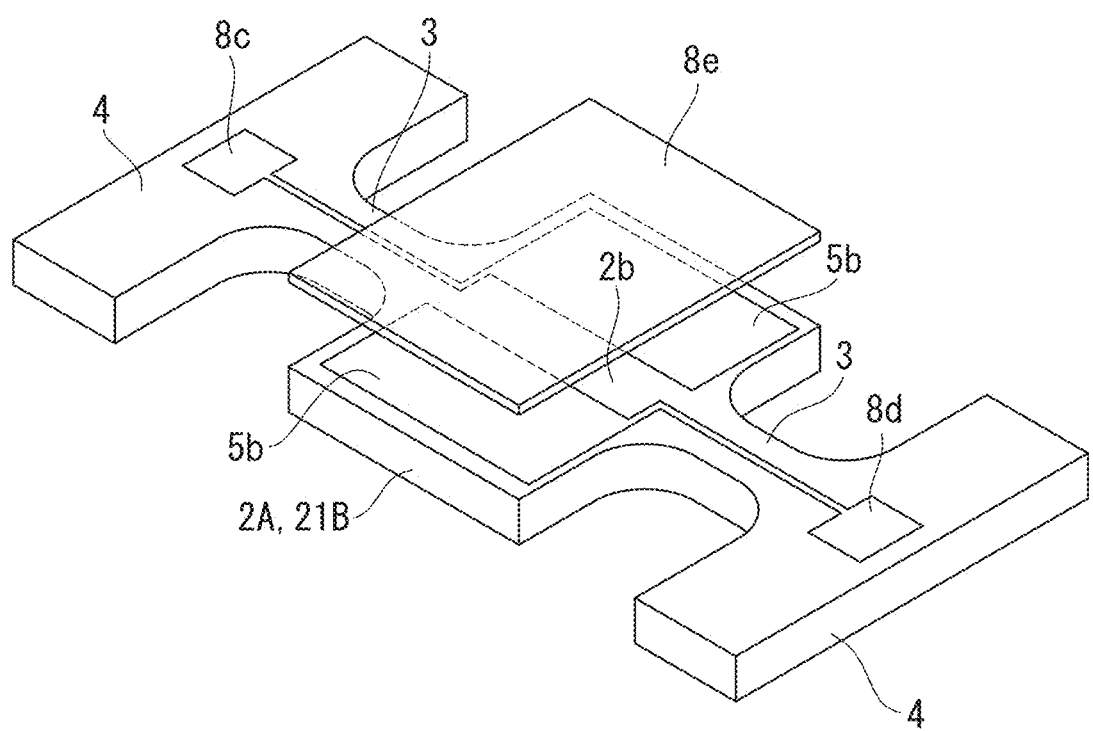
FIG. 11 illustrates the configuration of a driving-force generating member in a light deflector of the electrostatically driven type.

FIGS. 10 and 11 illustrate configuration examples of the driving-force generating member 5 provided in each of the movable units 2, 21, and 22. As mentioned above, the driving-force generating member 5 provided in the movable unit 2, 21, or 22 varies depending on the drive type of the light deflector 1, 10, or 11.

FIG. 10 illustrates a configuration example of the driving-force generating member 5 provided in the light deflector 1, 10, or 11 of an electromagnetically driven type, and schematically shows the layout of a drive coil 5a serving as the driving-force generating member 5. In FIG. 10, an insulation film and so on for protecting the drive coil 5a and so on are not shown.

As shown in FIG. 10, the drive coil 5a is routed along the edges of the movable unit 2, 21, or 22. One end of the drive coil 5a extends on one of the elastic members 3 and is electrically connected to an electrode pad 8a provided on one of the supporters 4. The other end of the drive coil 5a extends over a part thereof routed along an edge of the movable unit 2, 21, or 22, extends on the other elastic member 3, and is electrically connected to an electrode pad 8b provided on the other supporter 4.

A pair of permanent magnets 9 are provided near the light deflector 1, 10, or 11 of the electromagnetically driven type. The pair of permanent magnets 9 are disposed substantially parallel to the tilting axis A near the opposite sides of the movable unit 2, 21, or 22. The pair of permanent magnets 9 are magnetized in the same direction, which is substantially parallel to the driving-force generating surface 2b of the movable unit 2, 21, or 22 in a stationary state. The permanent magnets 9 generate a magnetic field, in a direction within the driving-force generating surface 2b and substantially orthogonal to the tilting axis A, in segments of the drive coil 5a located at the opposite sides of the movable unit 2, 21, or 22.

An alternating current flows through the drive coil 5a when an alternating voltage is applied to the two electrode pads 8a and 8b on the supporters 4. The electric current flowing through segments of the drive coil 5a near the permanent magnets 9 receives a Lorentz force in accordance with a mutual effect with the magnetic field generated by the permanent magnets 9. As a result, the movable unit 2, 21, or 22 receives, in the thickness direction, a force couple whose direction changes periodically in correspondence with the application of the alternating voltage. Therefore, the movable unit 2, 21, or 22 tilts, that is, oscillates, about the tilting axis A extending in the longitudinal direction of the two elastic members 3. As a result, a light beam reflected at the reflective surface 2a of the movable unit 2, 21, or 22 is periodically deflected at a fixed angular width.

FIG. 11 illustrates a configuration example of the driving-force generating member 5 provided in the light deflector 1, 10, or 11 of an electrostatically driven type, and schematically shows the layout of a pair of drive electrodes 5b serving as the driving-force generating member 5. In FIG. 11, an insulation film and so on for protecting the drive electrodes 5b and so on are not shown.

As shown in FIG. 11, the pair of drive electrodes 5b have identical shapes, are disposed symmetrically with respect to the tilting axis A, and extend substantially over the entire driving-force generating surface 2b. One of the drive electrodes 5b is electrically connected to an electrode pad 8c provided on one of the supporters 4 via a wire extending on one of the elastic members 3. The other drive electrode 5b is electrically connected to an electrode pad 8d provided on the other supporter 4 via a wire extending on the other elastic member 3.

The light deflector 1, 10, or 11 of the electrostatically driven type is provided with a fixed electrode 8e facing the drive electrodes 5b provided in the movable unit 2, 21, or 22. The fixed electrode 8e is fixed to a component (not shown), and is supported to face a certain direction. The fixed electrode 8e is maintained at, for example, a ground potential, and the pair of drive electrodes 5b alternately receive a predetermined potential via the corresponding electrode pads 8c and 8d. Accordingly, the drive electrodes 5b receive an electrostatic attractive force in accordance with a potential difference with the fixed electrode 8e. As a result, the movable unit 2, 21, or 22 receives, in the thickness direction, a force couple whose direction changes periodically in correspondence with the alternately applied potential. Therefore, the movable unit 2, 21, or 22 tilts, that is, oscillates, about the tilting axis A extending in the longitudinal direction of the pair of elastic members 3. As a result, a light beam reflected at the reflective surface 2a of the movable unit 2, 21, or 22 is periodically deflected at a fixed angular width.

REFERENCE SIGNS LIST 1, 10, 11 light deflector
2, 21, 22 movable unit
2a reflective surface
2b driving-force generating surface
21A first movable plate
21B second movable plate
3 elastic member
3a linear segment
3b first connection segment
3c second connection segment
4 supporter
61 first rib
62 second rib
A tilting axis

The invention claimed is:

1. A light deflector comprising:
a movable unit comprising a first movable plate and a second movable plate, the first movable plate having a reflective surface;
a supporter, and
an elastic member connecting the second movable plate to the supporter, the elastic member being configured to twist about a tilting axis to tilt the second movable plate,
wherein the elastic member comprising:
a linear segment having a substantially fixed width;
a first connection segment whose rigidity changes continuously, the first connection segment connecting a first end of the linear segment to the second movable plate, the first movable plate is provided rotatably together with the second movable plate about the tilting axis, the second movable plate being disposed on a first surface of the first movable plate opposite to the reflective surface of the first movable plate; and
a second connection segment connecting a second end of the linear segment to the supporter,
wherein a rigidity of the second connection segment continuously increases toward the supporter, and
a maximum width of the first connection segment is greater than a maximum width of the second connection segment.

2. The light deflector according to claim 1, wherein the second movable plate has a rigidity greater than a rigidity of the elastic member, and
the rigidity of the first connection segment continuously increases toward the movable unit.

3. The light deflector according to claim 2, wherein the elastic member extends substantially parallel to the tilting axis, and
a width of the first connection segment in a widthwise direction orthogonal to the tilting axis gradually increases toward the movable unit.

4. The light deflector according to claim 3, wherein a maximum width of the first connection segment in the widthwise direction is three or more times the width of the linear segment in the widthwise direction, and
a length of the first connection segment in a lengthwise direction parallel to the tilting axis is 1/10 or more of an overall length of the elastic member.

5. The light deflector according to claim 1, wherein the first connection segment has two first side surfaces opposed to each other in a widthwise direction orthogonal to the tilting axis, the two first side surfaces being curved surfaces having a first radius of curvature and connecting with side surfaces of the linear segment and side surfaces of the second movable plate,
the second connection segment has two second side surfaces opposed to each other in the widthwise direction, the two second side surfaces being curved surfaces having a second radius of curvature and connecting with the side surfaces of the linear segment and side surfaces of the supporter, and
the first radius of curvature is larger than the second radius of curvature.

6. A light deflector comprising:
a movable unit having a reflective surface;
a supporter, and
an elastic member connecting the movable unit to the supporter, the elastic member being configured to twist about a tilting axis to tilt the movable unit,
wherein the elastic member comprising a first connection segment whose rigidity changes continuously, the elastic member being connected to the movable unit at the first connection segment, and
the movable unit is formed of a first movable plate and a second movable plate;
the first movable plate comprises the reflective surface and at least one first rib located at a first surface opposite to the reflective surface;
the second movable plate is provided rotatably together with the first movable plate about the tilting axis, the second movable plate having at least one second rib located at a second surface of the second movable plate,
the at least one first rib intersecting the at least one second rib at an intersection position, and the at least one first rib and the at least one second rib are joined at the intersection position.

7. The light deflector according to claim 6, wherein the movable unit has a rigidity greater than a rigidity of the elastic member, and
the rigidity of the first connection segment continuously increases toward the movable unit.

8. The light deflector according to claim 7, wherein the elastic member extends substantially parallel to the tilting axis, and
a width of the first connection segment in a widthwise direction orthogonal to the tilting axis gradually increases toward the movable unit.

9. The light deflector according to claim 8, wherein the elastic member comprising:
a linear segment having a substantially fixed width;
a first connection segment whose rigidity changes continuously, the first connection segment connecting a first end of the linear segment to the movable unit;
a maximum width of the first connection segment in the widthwise direction is three or more times the width of the linear segment in the widthwise direction, and
a length of the first connection segment in a lengthwise direction parallel to the tilting axis is $1/10$ or more of an overall length of the elastic member.

10. The light deflector according to claim 6, wherein the first connection segment has two first side surfaces opposed to each other in a widthwise direction orthogonal to the tilting axis, the two first side surfaces being curved surfaces having a first radius of curvature and connecting with side surfaces of the linear segment and side surfaces of the second movable plate,
the elastic member includes a second connection segment, the second connection segment is provided between the first segment and the supporter,
the second connection segment has two second side surfaces opposed to each other in the widthwise direction, the two second side surfaces being curved surfaces having a second radius of curvature and connecting with the side surfaces of the linear segment and side surfaces of the supporter, and
the first radius of curvature is larger than the second radius of curvature.

11. The light deflector according to claim 1, wherein the second movable plate having a different shape in a plane parallel to the reflective surface than the first movable plate.

12. The light deflector according to claim 1, wherein:
the first movable plate comprises at least one first rib located at the first surface; and
the second movable plate comprising at least one second rib located at a second surface of the second movable plate.

13. The light deflector according to claim 12, wherein:
the at least one first rib intersecting the at least one second rib at an intersection position, and
the at least one first rib and the at least one second rib are joined at the intersection position.

14. The light deflector according to claim 1, wherein the maximum width of one or more of the first connection segment increases gradually towards the movable unit or the second connection segment increases gradually towards the supporter such that stress from the twisting of the linear segment is not transmitted to the movable unit.

* * * * *